United States Patent
Murayama et al.

(10) Patent No.: US 10,573,805 B2
(45) Date of Patent: Feb. 25, 2020

(54) MAGNETIC MEMORY DEVICE

(71) Applicant: TOSHIBA MEMORY CORPORATION, Minato-ku, Tokyo (JP)

(72) Inventors: Akiyuki Murayama, Tokyo (JP); Takeshi Iwasaki, Kuwana Mie (JP); Tadashi Kai, Yokohama Kanagawa (JP); Tadaomi Daibou, Yokohama Kanagawa (JP); Masaki Endo, Kawasaki Kanagawa (JP); Taichi Igarashi, Fuchu Tokyo (JP); Junichi Ito, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 8 days.

(21) Appl. No.: 15/910,696

(22) Filed: Mar. 2, 2018

(65) Prior Publication Data
US 2019/0088862 A1  Mar. 21, 2019

(30) Foreign Application Priority Data

Sep. 21, 2017 (JP) ................................. 2017-181462

(51) Int. Cl.

| | |
|---|---|
| *H01L 43/10* | (2006.01) |
| *H01L 43/08* | (2006.01) |
| *H01L 27/22* | (2006.01) |
| *H01L 43/12* | (2006.01) |
| *H01F 10/32* | (2006.01) |

(52) U.S. Cl.
CPC ............ *H01L 43/10* (2013.01); *H01L 27/228* (2013.01); *H01L 43/08* (2013.01); *H01F 10/329* (2013.01); *H01F 10/3286* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 8,558,331 B2 | 10/2013 | Zhu et al. | |
| 9,040,178 B2 | 5/2015 | Zhao et al. | |
| 9,117,995 B2 * | 8/2015 | Daibou | .................. H01L 43/08 |

(Continued)

FOREIGN PATENT DOCUMENTS

| | | |
|---|---|---|
| JP | 10255248 A | 9/1998 |
| JP | 2009081314 A | 4/2009 |

(Continued)

OTHER PUBLICATIONS

Yutaka Shimada, "Soft magnetic film," Current Topics in Amorphous Materials: Physics and Technology, 1993, pp. 211-213.

*Primary Examiner* — Michelle Mandala
(74) *Attorney, Agent, or Firm* — Holtz, Holtz & Volek PC

(57) ABSTRACT

According to one embodiment, a magnetic memory device includes a conductive underlayer having an amorphous structure and containing at least one first predetermined element selected from molybdenum (Mo), magnesium (Mg), rhenium (Re), tungsten (W), vanadium (V), and manganese (Mn), and a stacked structure provided on the underlayer, and including a first magnetic layer having a variable magnetization direction, a second magnetic layer having a fixed magnetization direction, and a nonmagnetic layer provided between the first magnetic layer and the second magnetic layer.

20 Claims, 17 Drawing Sheets

(56) References Cited

U.S. PATENT DOCUMENTS

| | | | |
|---|---|---|---|
| 9,508,926 B2 * | 11/2016 | Kitagawa | H01L 43/08 |
| 9,608,197 B2 | 3/2017 | Siddik et al. | |
| 2008/0191295 A1 * | 8/2008 | Ranjan | B82Y 25/00 |
| | | | 257/421 |
| 2009/0079018 A1 | 3/2009 | Nagase et al. | |
| 2010/0176472 A1 * | 7/2010 | Shoji | B82Y 25/00 |
| | | | 257/421 |
| 2011/0303995 A1 | 12/2011 | Worledge | |
| 2012/0070695 A1 | 3/2012 | Kitagawa et al. | |
| 2012/0088125 A1 * | 4/2012 | Nishiyama | B82Y 25/00 |
| | | | 428/828 |
| 2012/0267733 A1 | 10/2012 | Hu et al. | |
| 2013/0307099 A1 | 11/2013 | Kitagawa et al. | |
| 2014/0131824 A1 | 5/2014 | Kitagawa et al. | |
| 2016/0308112 A1 | 10/2016 | Tan et al. | |
| 2017/0170237 A1 * | 6/2017 | Jung | H01L 45/1233 |
| 2017/0294375 A1 | 10/2017 | Terada et al. | |
| 2018/0083065 A1 | 3/2018 | Endo et al. | |

FOREIGN PATENT DOCUMENTS

| | | |
|---|---|---|
| JP | 2012064818 A | 3/2012 |
| JP | 2013048210 A | 3/2013 |
| JP | 5514256 B2 | 6/2014 |
| JP | 5868394 B2 | 2/2016 |
| JP | 5868491 B2 | 2/2016 |
| JP | 2016537825 A | 12/2016 |
| JP | 2018049880 A | 3/2018 |
| TW | 201626507 A | 7/2016 |
| TW | 201709573 A | 3/2017 |

\* cited by examiner

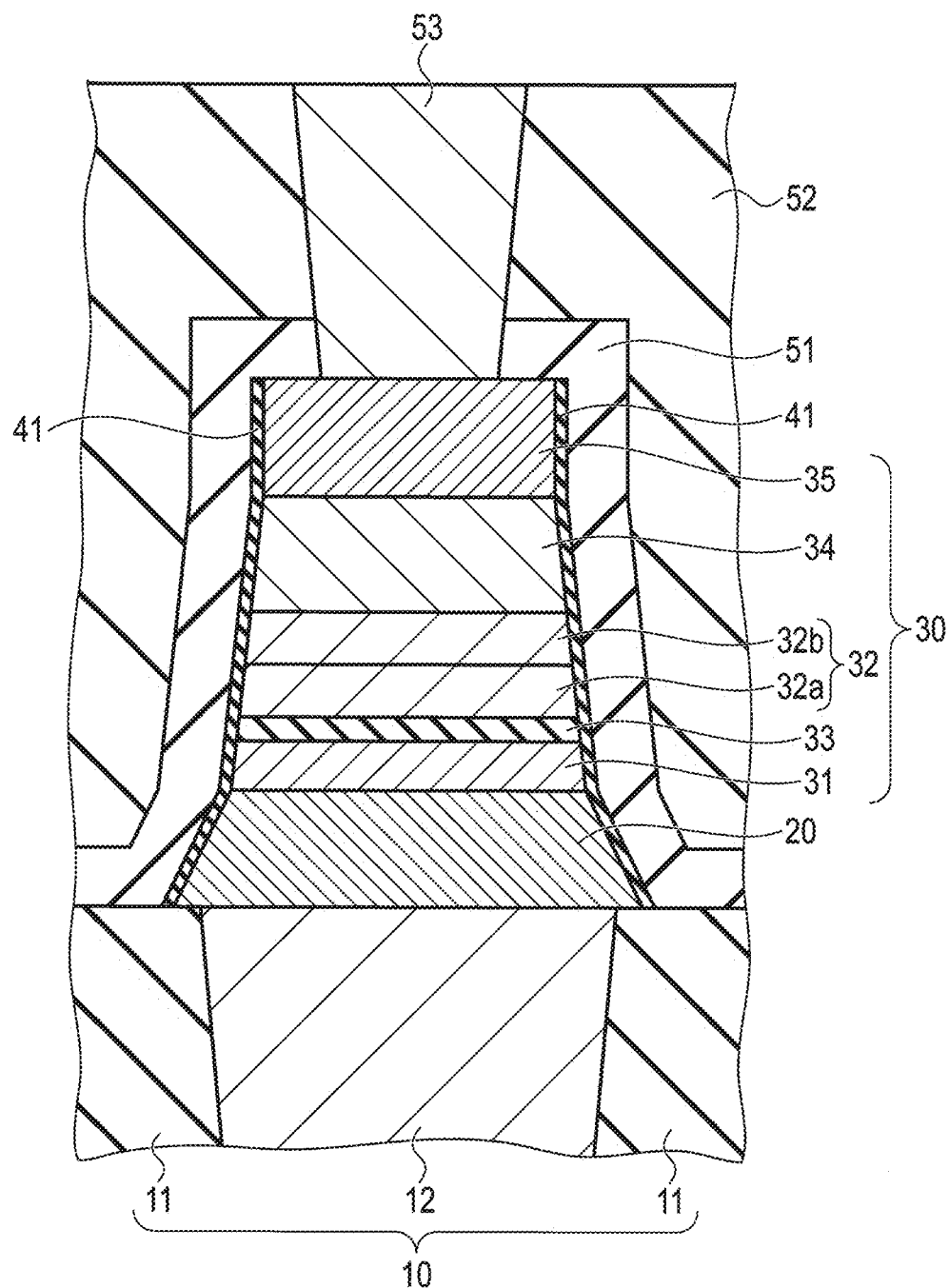
F I G. 1

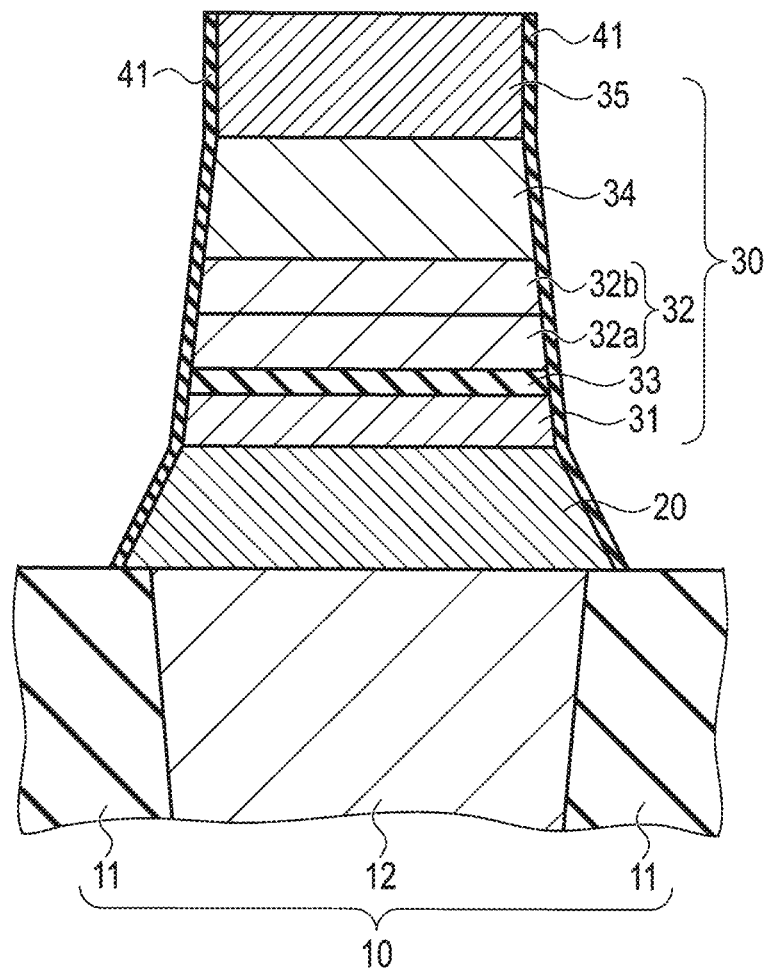
F I G. 4

| Element | Melting point |
|---|---|
| W | 3382°C |
| Re | 3167°C |
| Ta | 2850°C |
| Os | 2700°C |
| Mo | 2622°C |
| Nb | 1950°C |
| Ir | 2454°C |
| Ru | 2450°C |
| Hf | 2207°C |
| Zr | 1857°C |
F I G. 8
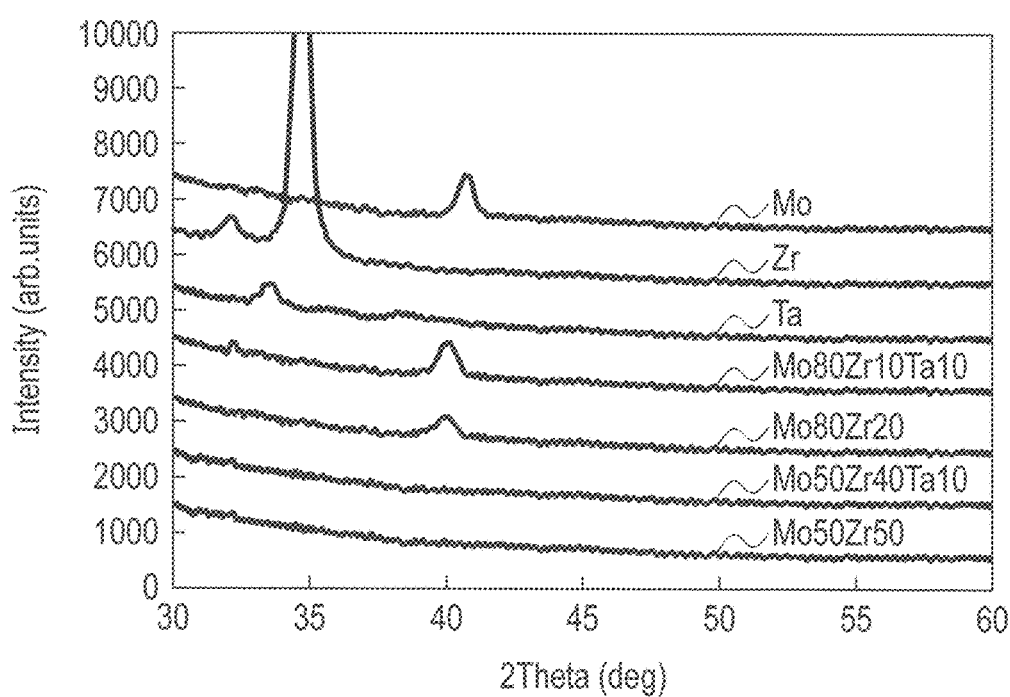
F I G. 9

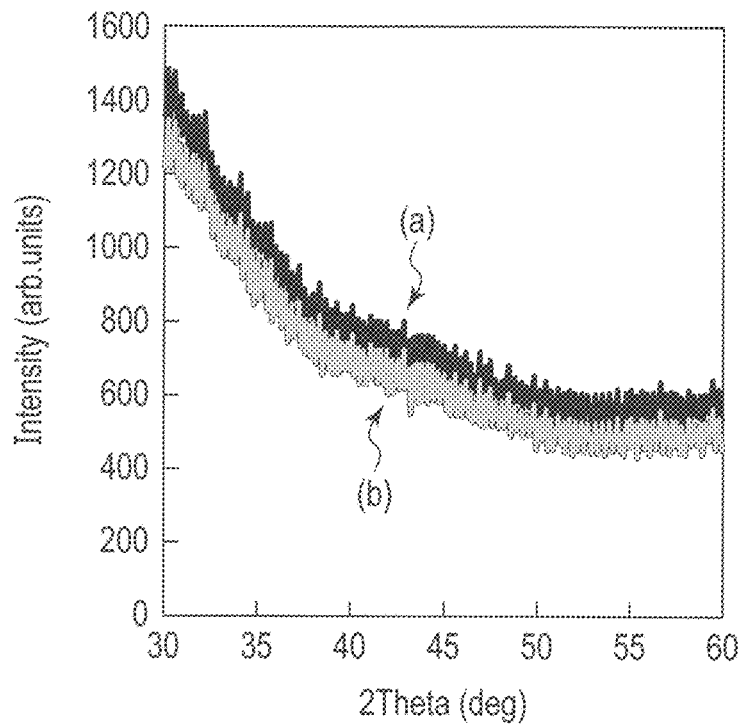
F I G. 10
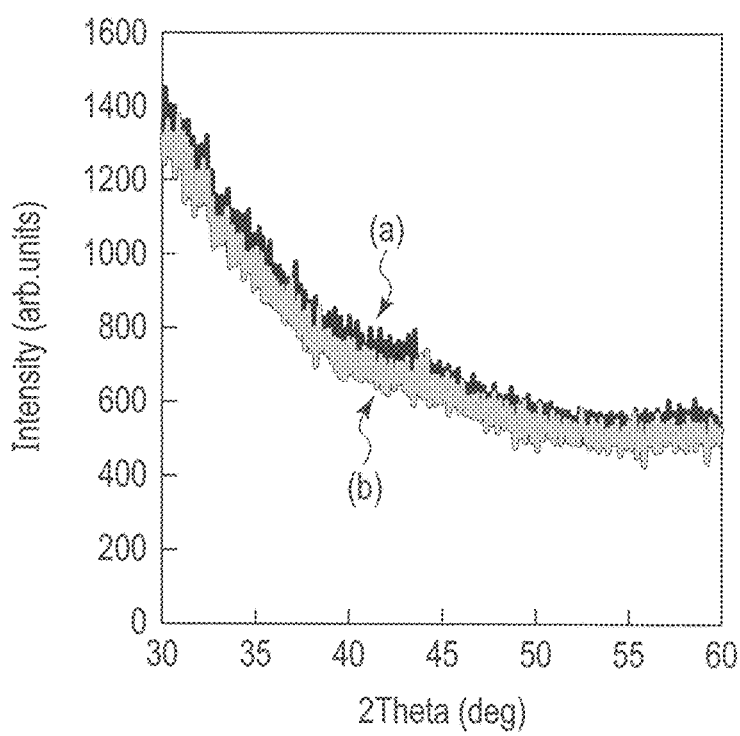
F I G. 11

| | R*=R(5nm)/R(20nm) | XRD peak | |
|---|---|---|---|
| | | as-deposition | After annealing |
| Mo | 9.2 | Present | Present |
| Zr | 24.6 | Present | Present |
| Mo80Zr20 | 8.8 | Present | Present |
| Mo50Zr50 | 9.4 | Not present | Not present |

| | R*=R(5nm)/R(20nm) | XRD peak | |
|---|---|---|---|
| | | as-deposition | After annealing |
| Mo | 9.2 | Present | Present |
| Ta | 5.5 | Present | Present |
| Mo80Zr10Ta10 | 8.6 | Present | Present |
| Mo50Zr40Ta10 | 8.3 | Not present | Not present |

|  | R*(5nm/20nm) | XRD peak | |
| --- | --- | --- | --- |
|  |  | as-deposition | After annealing |
| Mg | 18282 | Present | Present |
| Ta | 5.5 | Present | Present |
| Mg50Ta50 | 1349 | Not present | Not present |
F I G. 20
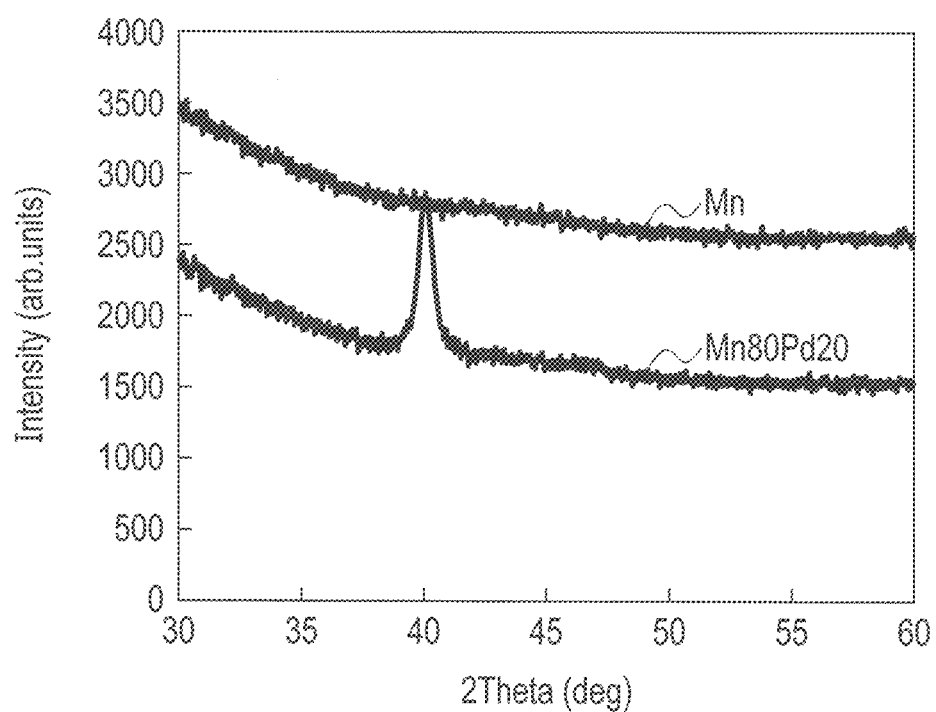
F I G. 21

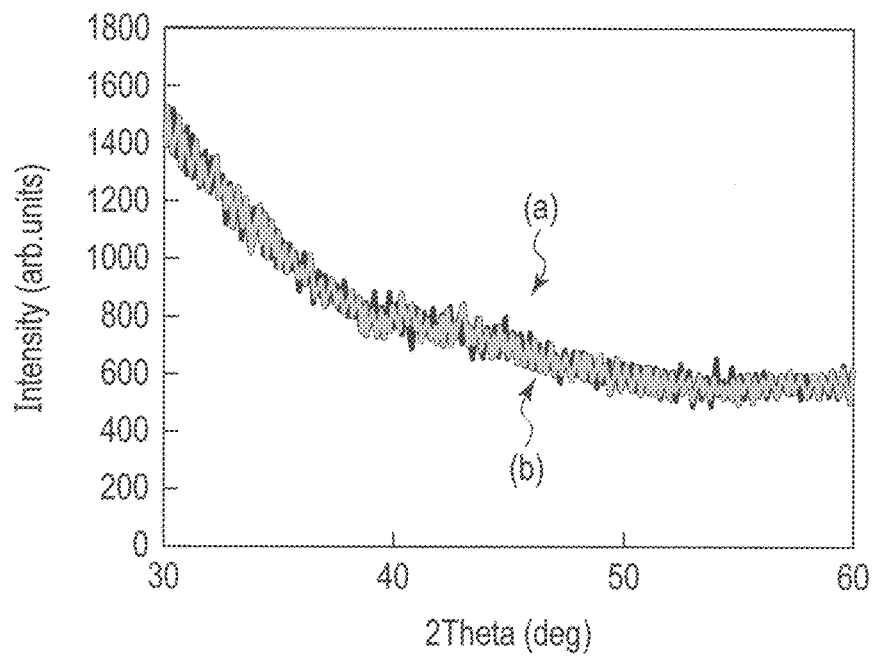
F I G. 22
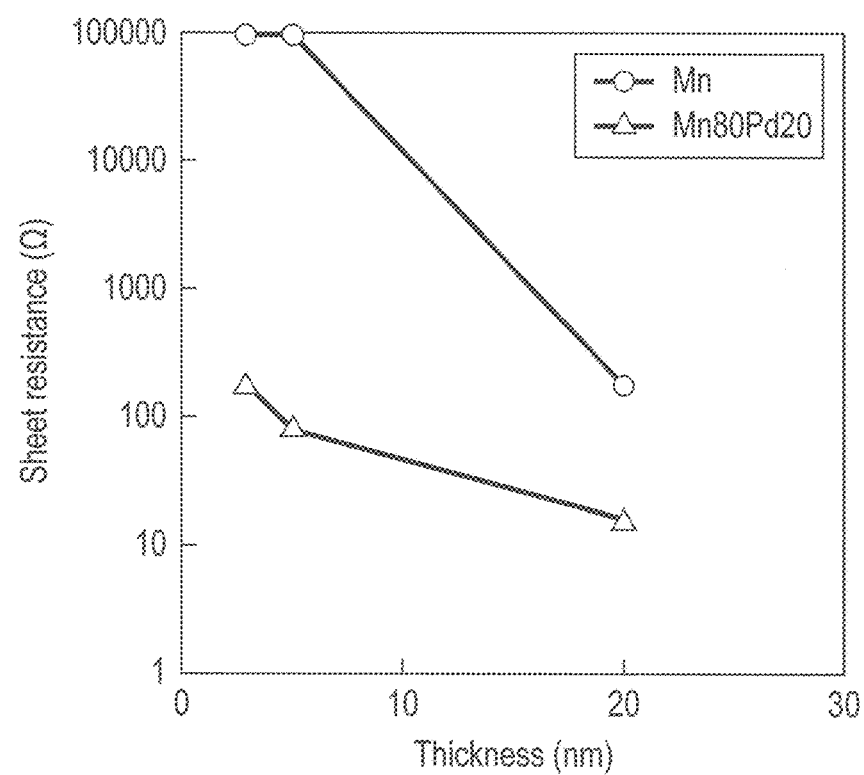
F I G. 23

|  | R*(5nm/20nm) | XRD peak | |
| --- | --- | --- | --- |
|  |  | as-deposition | After annealing |
| Mn | 594 | Not present | Not present |
| Mn80Pd20 | 5.0 | Present | Present |

US 10,573,805 B2

MAGNETIC MEMORY DEVICE

CROSS-REFERENCE TO RELATED APPLICATIONS

This application is based upon and claims the benefit of priority from Japanese Patent Application No. 2017-181462, filed Sep. 21, 2017, the entire contents of which are incorporated herein by reference.

FIELD

Embodiments described herein relate generally to a magnetic memory device.

BACKGROUND

A magnetic memory device is proposed in which magnetoresistive elements and MOS transistors are integrated on a semiconductor substrate.

The above-described magnetoresistive element is typically configured such that a stacked structure including a storage layer, a tunnel barrier layer, and a reference layer is provided on an underlayer. Therefore, in order to achieve an excellent magnetoresistive element, it is important to choose an appropriate underlayer.

However, conventionally, a magnetoresistive element having an appropriate underlayer is not necessarily proposed.

BRIEF DESCRIPTION OF THE DRAWINGS

FIG. 1 is a cross-sectional view schematically showing a configuration of a magnetic memory device according to an embodiment;

FIG. 4 is a cross-sectional view schematically showing a part of the manufacturing method of the magnetic memory device of the embodiment;

FIG. 8 is a table showing elements having high melting points;

FIG. 9 is a graph showing results of XRD measurement of first materials for an underlayer according to the embodiment and a comparative example, in an as-deposition state;

FIG. 10 is a graph showing results of XRD measurement of a first material for the underlayer according to the embodiment;

FIG. 11 is a graph showing results of XRD measurement of a first material for the underlayer according to the embodiment;

FIG. 20 is a table showing results of measurement of the second materials for the underlayer according to the embodiment and the comparative example;

FIG. 21 is a graph showing results of XRD measurement of third materials for the underlayer according to the embodiment and a comparative example, in an as-deposition state;

FIG. 22 is a graph showing results of XRD measurement of the third material for the underlayer according to the embodiment;

FIG. 23 is a graph showing results of measurement of sheet resistances of the third materials for the underlayer according to the embodiment and the comparative example, after performing an oxidation treatment;

DETAILED DESCRIPTION

Figure 2:
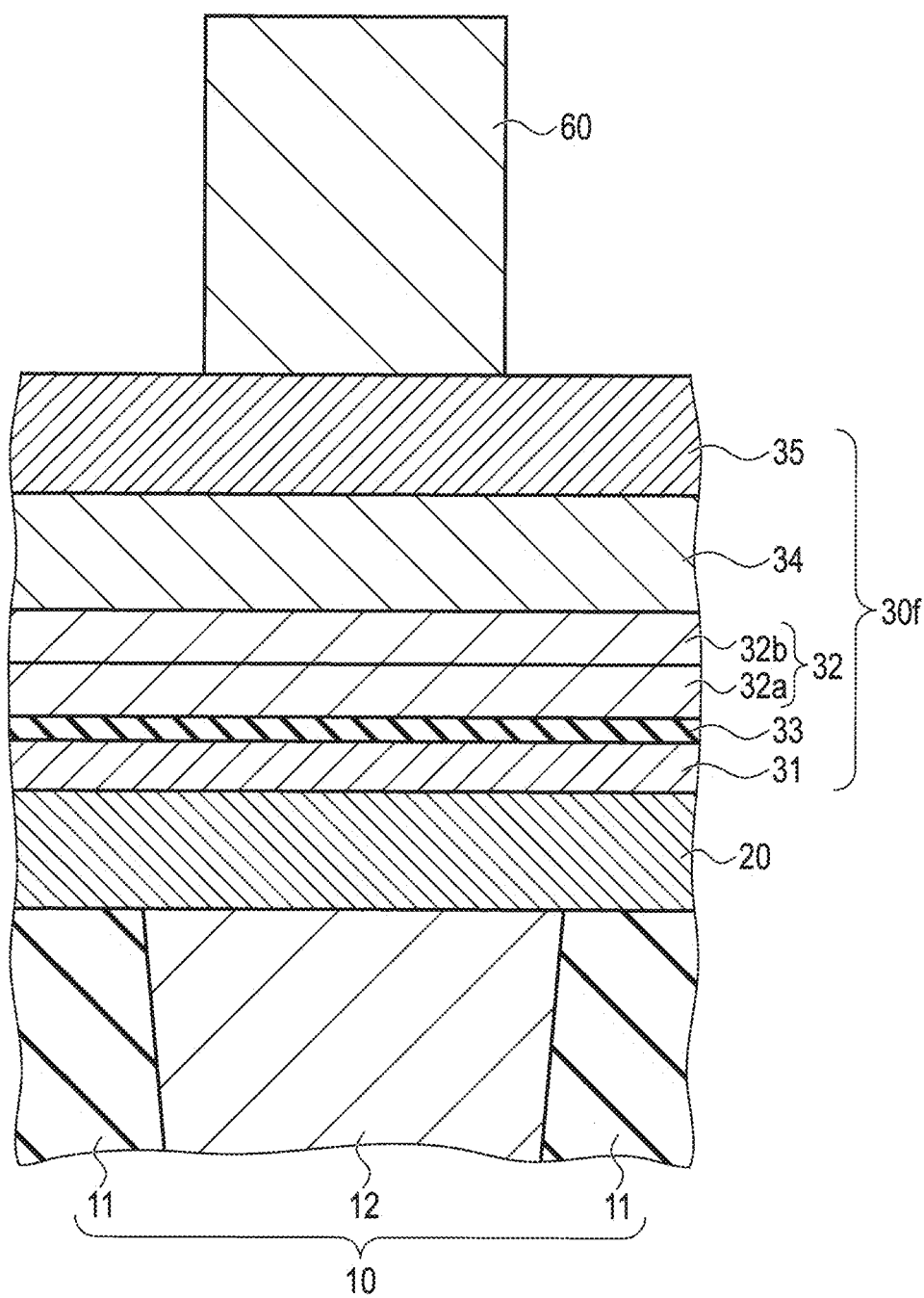
FIG. 2 is a cross-sectional view schematically showing a part of a manufacturing method of the magnetic memory device of the embodiment.

In general, according to one embodiment, a magnetic memory device includes: a conductive underlayer having an amorphous structure and containing at least one first predetermined element selected from molybdenum (Mo), magnesium (Mg), rhenium (Re), tungsten (W), vanadium (V), and manganese (Mn); and a stacked structure provided on the underlayer, and including a first magnetic layer having a variable magnetization direction, a second magnetic layer having a fixed magnetization direction, and a nonmagnetic layer provided between the first magnetic layer and the second magnetic layer.

Hereinafter, an embodiment will be described with reference to the drawings.

FIG. 1 is a cross-sectional view schematically showing a configuration of a magnetic memory device (semiconductor integrated circuit device) according to the embodiment.

A lower part structure 10 includes a semiconductor substrate (not shown), a MOS transistor (not shown), an inter-layer insulating film 11, a bottom electrode 12, and the like. The bottom electrode 12 functions as one electrode with respect to a magnetoresistive element and is electrically connected to the MOS transistor (not shown) and an underlayer 20 to be described later.

A magnetoresistive element is provided on the lower part structure 10. The magnetoresistive element includes the conductive underlayer 20 and a stacked structure 30 provided on the underlayer 20. The magnetoresistive element of the present embodiment is an STT (spin transfer torque) type magnetoresistive element. Note that, a magnetoresistive element is also referred to as an MTJ (magnetic tunnel junction) element.

The underlayer 20 is a conductive layer having an amorphous structure and is provided between the lower part structure 10 and the stacked structure 30. The underlayer 20 contains at least one first predetermined element selected from molybdenum (Mo), magnesium (Mg), rhenium (Re), tungsten (W), vanadium (V), and manganese (Mn) and may further contain at least one second predetermined element selected from zirconium (Zr), tantalum (Ta), hafnium (Hf), and niobium (Nb). In a case that there is a plurality of layers between the lower part structure 10 and the stacked structure 30, the layer in contact with the stacked structure 30 corresponds to the above-described underlayer 20. Note that the underlayer 20 will be described later in detail.

The stacked structure 30 includes a first magnetic layer used as a storage layer 31, a second magnetic layer used as a reference layer 32, and a nonmagnetic layer 33 provided between the storage layer 31 and the reference layer 32 and used as a tunnel barrier layer 33. In the present embodiment, the stacked structure 30 further includes a third magnetic layer used as a shift canceling layer 34 and a cap layer 35, in addition to the storage layer 31, the reference layer 32, and the tunnel barrier layer 33. In the present embodiment, the storage layer 31 is provided between the underlayer 20 and the tunnel barrier layer 33 and is in contact with the underlayer 20.

The storage layer (the first magnetic layer) 31 is a ferromagnetic layer having a perpendicular magnetization (having a magnetization direction perpendicular to a principal surface of the storage layer 31) and has a variable magnetization direction. The storage layer 31 is a conductive layer and contains iron (Fe) and boron (B). The storage layer 31 may further contain cobalt (Co) in addition to iron (Fe) and boron (B). In the present embodiment, the storage layer 31 is formed of CoFeB.

The reference layer (the second magnetic layer) 32 is a ferromagnetic layer having a perpendicular magnetization and has a fixed magnetization direction. The reference layer 32 includes a first sub-magnetic layer 32a and a second sub-magnetic layer 32b. The first sub-magnetic layer 32a is a conductive layer and contains iron (Fe) and boron (B). The first sub-magnetic layer 32a may further contain cobalt (Co) in addition to iron (Fe) and boron (B). In the present embodiment, the first sub-magnetic layer 32a is formed of CoFeB. The second sub-magnetic layer 32b is a conductive layer and contains cobalt (Co) and at least one element selected from platinum (Pt), nickel (Ni), and palladium (Pd). In the present embodiment, the second sub-magnetic layer 32b is formed of a multilayer of Co/Pt, a multilayer of Co/Ni, or a multilayer of Co/Pd. An intermediate layer formed of tantalum (Ta) or the like may be provided between the first sub-magnetic layer 32a and the second sub-magnetic layer 32b.

Note that the fact that a magnetization direction is variable means that the magnetization direction changes in response to a predetermined write current, and the fact that a magnetization direction is fixed means that the magnetization direction does not change in response to a predetermined write current.

The tunnel barrier layer (the nonmagnetic layer) 33 is an insulation layer disposed between the storage layer 31 and the reference layer 32 and contains magnesium (Mg) and oxygen (O). In the present embodiment, the tunnel barrier layer 33 is formed of MgO.

The shift canceling layer (the third magnetic layer) 34 is a ferromagnetic layer having a perpendicular magnetization and has a fixed magnetization direction antiparallel to the magnetization direction of the reference layer 32. The shift canceling layer 34 has a function to cancel a magnetic field applied to the storage layer 31 from the reference layer 32. The shift canceling layer 34 is a conductive layer and contains cobalt (Co) and at least one element selected from platinum (Pt), nickel (Ni) and palladium (Pd). In the present embodiment, the shift canceling layer 34 is formed of a multilayer of Co/Pt, a multilayer of Co/Ni, or a multilayer of Co/Pd. Note that an intermediate layer formed of ruthenium (Ru) or the like may be provided between the shift canceling layer 34 and the reference layer 32.

The cap layer 35 is a conductive layer provided at a top part of the stacked structure 30 and is formed of a predetermined metallic material.

On a sidewall of the underlayer 20 and the stacked structure 30, there is provided an insulating sidewall layer 41 along the sidewall of the underlayer 20 and the stacked structure 30. The insulating sidewall layer 41 contains the at least one of the first predetermined element (Mo, Mg, Re, W, V, or Mn) contained in the underlayer 20 and oxygen (O). Further, the insulating sidewall layer 41 may further contain the at least one of the second predetermined element (Zr, Ta, Hf, or Nb) contained in the underlayer 20. The insulating sidewall layer 41 is provided on at least a side surface of the nonmagnetic layer 33. In the present embodiment, the insulating sidewall layer 41 is provided on the entire sidewall of the stacked structure 30. The insulating sidewall layer 41 will be described later in detail.

The underlayer 20, the stacked structure 30, and the insulating sidewall layer 41 are surrounded by an insulating protective film 51. As the insulating protective film 51, a silicon nitride film is used, for example. The insulating protective film 51 is surrounded by an inter-layer insulating film 52. As the inter-layer insulating film 52, a silicon oxide film is used, for example. A hole is formed in the insulating protective film 51 and the inter-layer insulating film 52, and a top electrode 53 is provided in the hole. The top electrode 53 functions as one of the electrodes of the magnetoresistive element and is electrically connected between a bit-line (not shown) and the cap layer 35.

In the above-described magnetoresistive element, when the magnetization direction of the storage layer 31 and the magnetization direction of the reference layer 32 are parallel to each other, the magnetoresistive element (the stacked structure 30) exhibits a low resistance state. When the magnetization direction of the storage layer 31 and the magnetization direction of the reference layer 32 are antiparallel to each other, the magnetoresistive element (the stacked structure 30) exhibits a high resistance state. Therefore, the magnetoresistive element can store binary data, based on the resistance state of the magnetoresistive element. Further, a resistance state can be set in the magnetoresistive element, according to a direction of a current flowing through the stacked structure 30, which means a binary data can be written in.

Next, a method for manufacturing a magnetic memory device according to the present embodiment will be described with reference to FIG. 2 to FIG. 4 and FIG. 1.

First, as shown in FIG. 2, the underlayer 20 and a stacked film 30f for a magnetoresistive element are formed on the lower part structure 10 including the semiconductor substrate (not shown), the MOS transistor (not shown), the inter-layer insulating film 11, the bottom electrode 12, and the like. Specifically, on the lower part structure 10, there are formed by a sputtering process the underlayer 20, the storage layer 31, the tunnel barrier layer 33, the reference layer (the first sub-magnetic layer 32a and the second sub-magnetic layer 32b) 32, the shift canceling layer 34, and the cap layer 35. Subsequently, thermal processing is performed. By this thermal processing, the storage layer 31, the reference layer 32, and the like are crystallized. Further, a hard mask 60 is formed on the cap layer 35.

Figure 3:
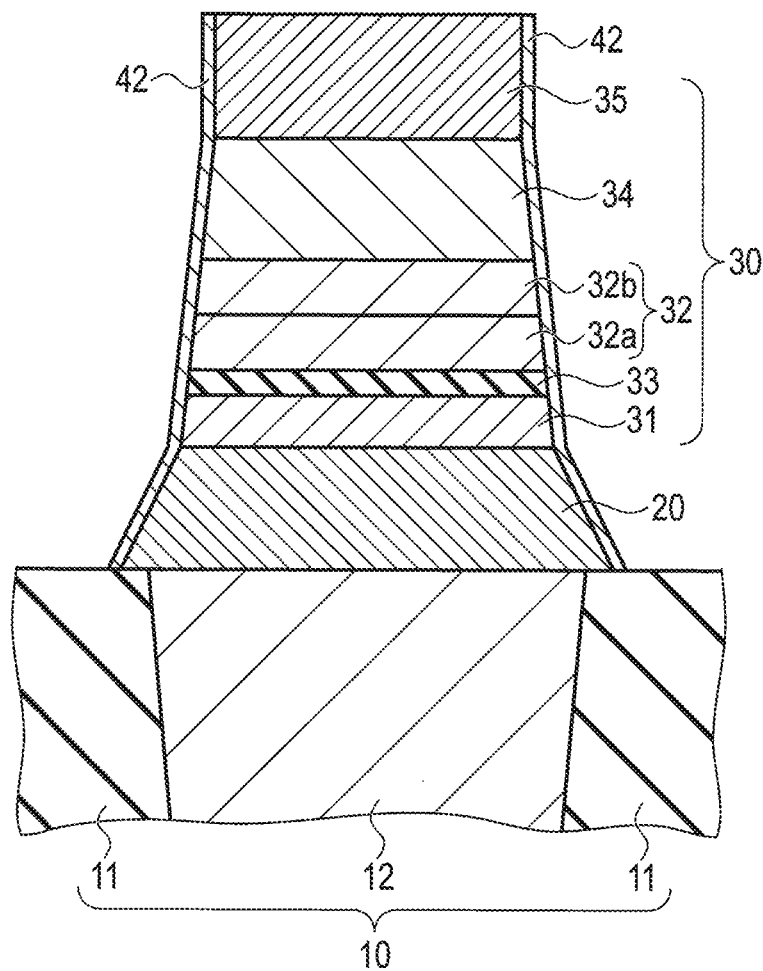
FIG. 3 is a cross-sectional view schematically showing a part of a manufacturing method of the magnetic memory device of the embodiment.

Next, as shown in FIG. 3, the stacked film 30f and the under gayer 20 are patterned by using the hard mask 60 as a mask. Specifically, IBE (ion beam etching) is used to pattern the stacked film 30f and the underlayer 20. Argon (Ar) ion is used for the ion beam. By this IBE, a pattern of the underlayer 20 and a pattern of the stacked film 30f (the stacked structure 30) are obtained. Further, by this IBE, a sidewall layer 42 is formed on the sidewalls of the underlayer 20 and the stacked structure 30 along the sidewalls of the underlayer 20 and the stacked structure 30. This sidewall layer 42 is a redeposition layer formed when the stacked film 30f and the underlayer 20 are etched by the IBE. Therefore, the sidewall layer 42 contains elements contained in the stacked film 30l and the under layer 20. Since the stacked film 30l and the underlayer 20 contains metal element, the sidewall layer 42 is conductive.

Next, as shown in FIG. 4, in an oxidizing atmosphere, an oxidation treatment is performed on the structure obtained in FIG. 3. As a result, the sidewall layer 42 is oxidized, and the insulating sidewall layer 41 is thus formed on the sidewalls of the underlayer 20 and the stacked structure 30 along the sidewalls of the underlayer 20 and the stacked structure 30. Specifically, the metal element contained in the sidewall layer 42 is oxidized, and the insulating sidewall layer 41 is thus formed. Generally, oxide is insulator in many cases. Therefore, since the sidewall layer 42 is oxidized and the insulating sidewall layer 41 is thus formed, a conductive layer on the sidewall of the stacked structure 30 becomes insulating. If the layer on the sidewall of the stacked structure 30 is conductive, the storage layer 31 and the reference layer 32 are conductive to each other; therefore, the magnetoresistive element cannot properly operate. By changing the sidewall layer 42 into the insulating sidewall layer 41 by oxidation, the storage layer 31 and the reference layer 32 are insulated from each other; therefore, the proper operation of the magnetoresistive element is secured.

Next, as shown in FIG. 1, the insulating protective film 51 is formed to surround the underlayer 20, the stacked structure 30, and the insulating sidewall layer 41, and the inter-layer insulating film 52 is then formed to surround the insulating protective film 51. Subsequently, a hole is formed in the insulating protective film 51 and the inter-layer insulating film 52 such that the hole reaches the cap layer 35. Further, the top electrode 53 is formed in the hole, and the structure shown in FIG. 1 is thus obtained.

Next, the underlayer 20 in the present embodiment will be described in detail.

On the underlayer 20, the stacked structure 30 including the storage layer 31 and the like are formed. Therefore, in order to obtain the stacked structure 30 having excellent properties, selection of the underlayer 20 is important. Generally, the underlayer 20 is required to have the following properties.

(a) In order to form on the underlayer 20 the stacked structure 30 which has excellent quality and is excellent in crystallinity, it is preferable to use the underlayer 20 excellent in flatness. If the underlayer 20 has crystallinity, it is difficult to obtain the underlayer 20 excellent in flatness. Therefore, it is preferable that the underlayer 20 have an amorphous structure. Specifically, the underlayer 20 preferably has an amorphous structure in an as-deposition state and in a final state (final structure) after being subjected to process such as a thermal treatment.

(b) A write operation and a read operation on the magnetoresistive element are performed by feeding a current through the magnetoresistive element. Therefore, the underlayer 20 preferably has low resistance (low sheet resistance).

(c) If a shunt failure (a shunt failure between the storage layer 31 and the reference layer 32) occurs on the sidewall of the stacked structure 30, a proper operation of the magnetoresistive element is impeded. In order to prevent such a shunt failure, it is necessary to form the insulating sidewall layer 41 having insulation properties by oxidizing the conductive sidewall layer 42 formed on the sidewall of the stacked structure 30. For that purpose, it is preferable that the element contained in the sidewall layer 42 be easily oxidized. Because the underlayer 20 is etched later than the other layers, the sidewall layer 42 relatively highly contains the element contained in the underlayer 20. Therefore, it is preferable that the element contained in the underlayer 20 can be easily oxidized.

(d) If the element contained in the underlayer 20 diffuses into the stacked structure 30 and adversely affects the properties of the stacked structure 30, the properties of the magnetoresistive element become bad. Therefore, it is preferable that the underlayer 20 include no such element that adversely affects the properties of the stacked structure 30. For example, if HfB is used as material for the underlayer 20, the above-mentioned properties (a), (b), and (c) may be able to be satisfied. However, boron (B) contained in HfB easily diffuses into the stacked structure 30 and can adversely affect the properties of the magnetoresistive element.

As described above, it is preferable to use as the material for the underlayer 20 material which satisfies the above-described properties (a), (b), and (c) and do not contain boron (B). In the present embodiment, the material for the underlayer 20 is selected from the above points of view.

Hereinafter, materials appropriate for the underlayer 20 will be described. Basically, as a candidate for the material appropriate for the underlayer 20, material is selected which contains both of an element (a first predetermined element) satisfying the above-described property (c) and an element (a second predetermined element) satisfying the above-described property (a).

The above-described first predetermined element is easily oxidized. In other words, the first predetermined element is preferably an element which is easily corroded.

Figure 5:
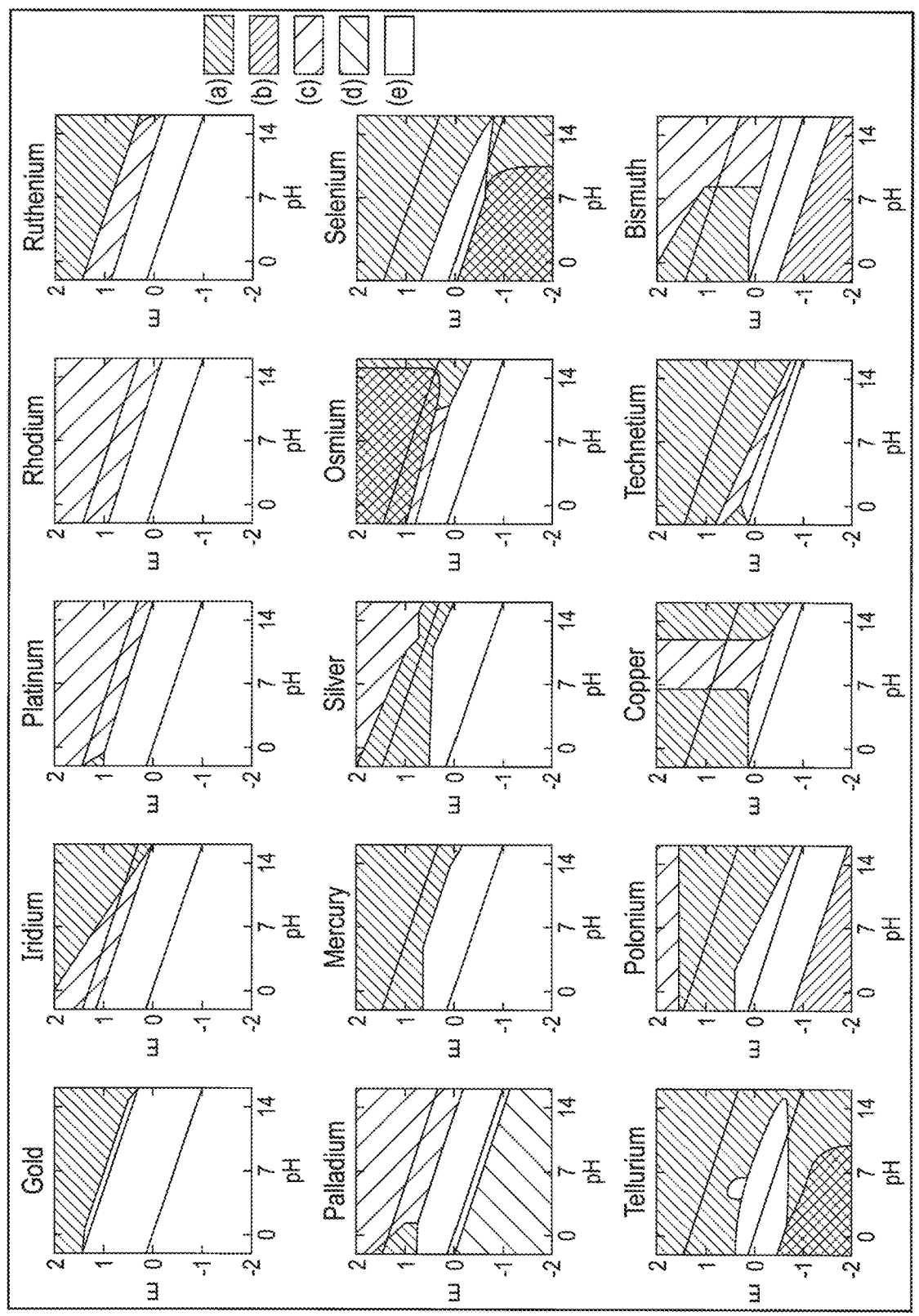
FIG. 5 shows electrode potential-pH charts for evaluation of corrosion properties of various elements.
Figure 6:
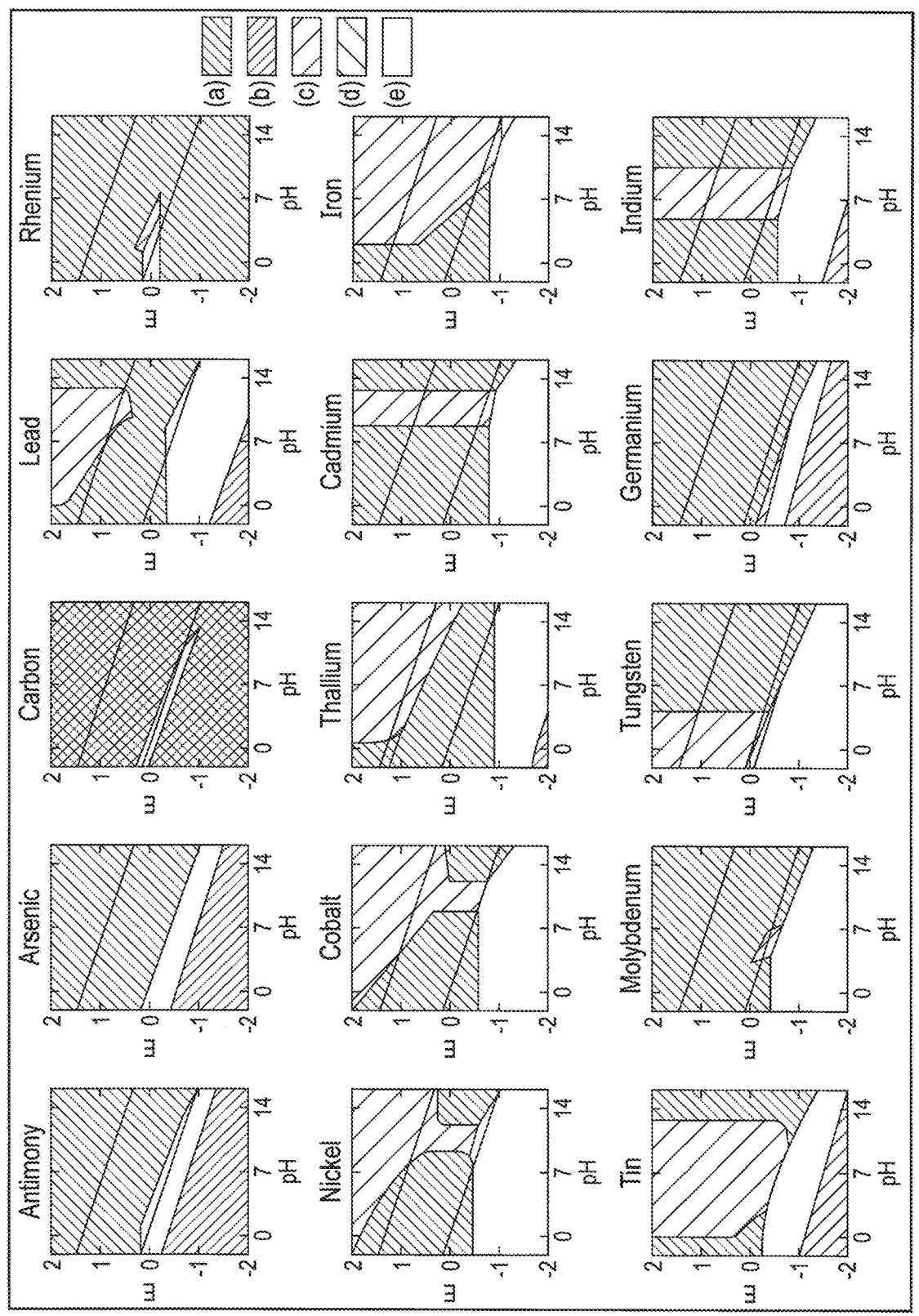
FIG. 6 shows electrode potential-pH charts for evaluation of corrosion properties of various elements.
Figure 7:
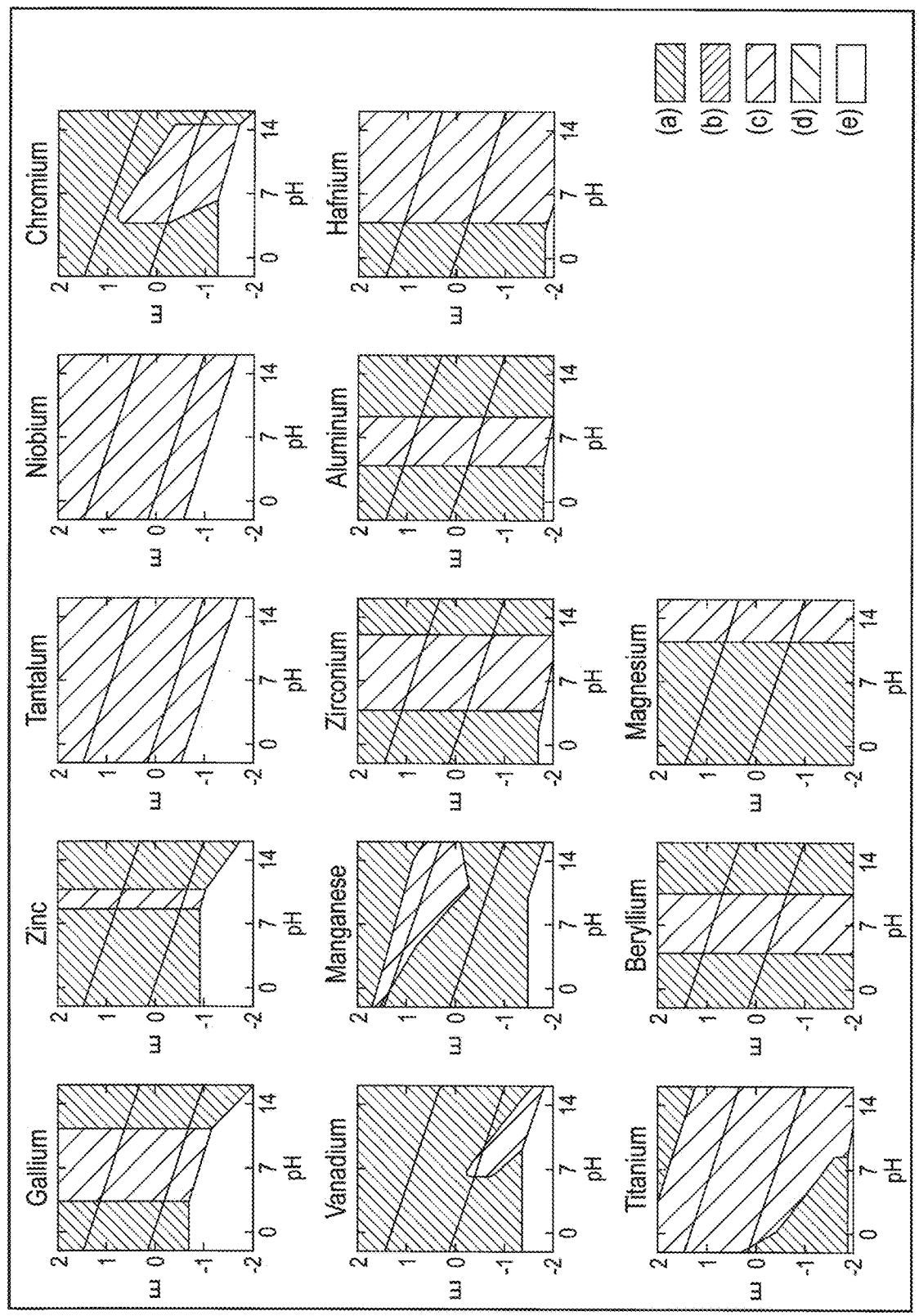
FIG. 7 shows electrode potential-pH charts for evaluation of corrosion properties of various elements.

FIG. 5 to FIG. 7 are electrode potential-pH charts of Pourbaix (M. Pourbaix: Werks. U. Korros., 11 761 (1960)), in which corrosion properties of various elements are put together. The horizontal axis represents pH, and the vertical axis represents an electrode potential. The region (a) represents a corrosion region (analytical concentration $C_M \geq 10^{-6}$ mol/kgH$_2$O) based on dissolution into solution. The region (b) represents a corrosion region (partial pressure P$_M$≥10$^{-6}$ atm) based on vaporization to gas. The region (c) represents a passive region based on a hydrous oxide film. The region (d) represents a passive region based on a hydride film. The region (e) represents an insensitive region. The region (a) and region (b) correspond to the corrosion region, and the region (c), region (d), and region (e) correspond to a non-corrosion region. These charts relate to corrosion of metal in aqueous solution, and the situation is therefore different from the situation in the present embodiment; however, the charts can be used as a rough indication, and if a point which is in the vicinity of the center of the chart at which pH=7 and E=0 is included in the region (a) or the region (b), the material is determined to be easily corroded (easily oxidized).

As can be understood from FIG. 5 to FIG. 7, candidates for the first predetermined element which is easily corroded (easily oxidized) include antimony (Sb), arsenic (As), carbon (C), lead (Pb), rhenium (Re), nickel (Ni), cobalt (Co), thallium (Tl), cadmium (Cd), molybdenum (Mo), tungsten (W), germanium (Ge), zinc (Zn), vanadium (V), manganese (Mn), and magnesium (Mg). Of these elements, antimony (Sb), arsenic (As), carbon (C), lead (Pb), thallium (Tl), cadmium (Cd), and germanium (Ge) are elements difficult to use (difficult to handle, and difficult to lower the resistance), nickel (Ni) and cobalt (Co) are ferromagnetic elements, and zinc (Zn) is an element having a low melting point (melting point: 420° C.); therefore, these elements should be eliminated from the candidates for the first predetermined element. As a result, rhenium (Re), molybdenum (Mo), tungsten (W), vanadium (V), manganese (Mn), and magnesium (Mg) are potential candidates for the first predetermined element.

The above-described second predetermined elements tend to be in an amorphous structure. In other words, the second predetermined element is preferably an element having a high melting point.

FIG. 8 is a table showing elements having high melting points (candidates for the second predetermined element) (Iwanami's dictionary of physics and chemistry, 3rd edition, 1971). Of the elements shown in FIG. 8, osmium (Os), iridium (Ir), and ruthenium (Ru) have high corrosion resistance and should be therefore eliminated from the candidates for the second predetermined element. Further, tungsten (W), rhenium (Re), and molybdenum (Mo) have been already picked up as the first predetermined element. As a result, tantalum (Ta), niobium (Nb), hafnium (Hf), and zirconium (Zr) are possible candidates for the second predetermined element.

The above description shows that the underlayer 20 preferably contains at least one first predetermined element selected from molybdenum (Mo), magnesium (Mg), rhenium (Re), tungsten (W), vanadium (V), and manganese (Mn). Further, it is preferable that the underlayer 20 further contain, in addition to the first predetermined element, at least one second predetermined element selected from zirconium (Zr), tantalum (Ta), hafnium (Hf), and niobium (Nb).

Hereinafter, a description will be given of examples of material which can be used as the underlayer 20.

First, a case will be described in which material containing molybdenum (Mo) and zirconium (Zr) is used as a first material for the underlayer 20. In this case, the first material contains molybdenum (Mo) as the first predetermined element and zirconium (Zr) as the second predetermined element. Further, the first material may further includes tantalum (Ta) in addition to molybdenum (Mo) and zirconium (Zr). When the above first materials are used, a composition ration of molybdenum (Mo) contained in the underlayer 20 preferably is less than 60%.

Hereinafter, a description will be given on the first material with reference to various measurement results. Note that each measurement is conducted using a sample in which a first material film is formed on a silicon oxide substrate.

FIG. 9 is a graph showing results of XRD (X-Ray Diffraction) measurement of the first materials in an as-deposition state. As shown in FIG. 9, a peak is observed with respect to any of the material containing only molybdenum (Mo), the material containing only zirconium (Zr), and the material containing only tantalum (Ta). Further, a peak is observed also with respect to the material of Mo80Zr10Ta10 (Mo: 80 atom %, Zr: 10 atom %, and Ta: 10 atom %) and the material of Mo80Zr20 (Mo: 80 atom %, and Zr: 20 atom %). In contrast, no peak is observed with respect to any of the material of Mo50Zr40Ta10 (Mo: 50 atom %, Zr: 40 atom %, and Ta: 10 atom %) and the material of Mo50Zr50 (Mo: 50 atom % and Zr: 50 atom %). Therefore, it is understood that the materials having no peak observed (Mo50Zr40Ta10 and Mo50Zr50) have no crystallinity and are in an amorphous structure.

FIG. 10 is a graph showing results of XRD measurement of a material of Mo50Zr50 (Mo: 50 atom % and Zr: 50 atom %). The symbol (a) represents the measurement result in an as-deposition state, and the symbol (b) represents the measurement result after annealing at a temperature of 300° C. No peak is observed any of the as-deposition state and the state after annealing. Therefore, it can be understood that the material of Mo50Zr50 stays in an excellent amorphous state after annealing is performed.

FIG. 11 is a graph showing results of XRD measurement of a material of Mo50Zr40Ta10 (Mo: 50 atom %, Zr: 40 atom %, and Ta 10 atom %). The symbol (a) represents the measurement result in an as-deposition state, and the symbol (h) represents the measurement result after annealing at a temperature of 300° C. No peak is observed in any of the as-deposition state and the state after annealing. Therefore, it is understood that the material of Mo50Zr40Ta10 stays in an excellent amorphous state even after annealing is performed.

Figures 12, 13:
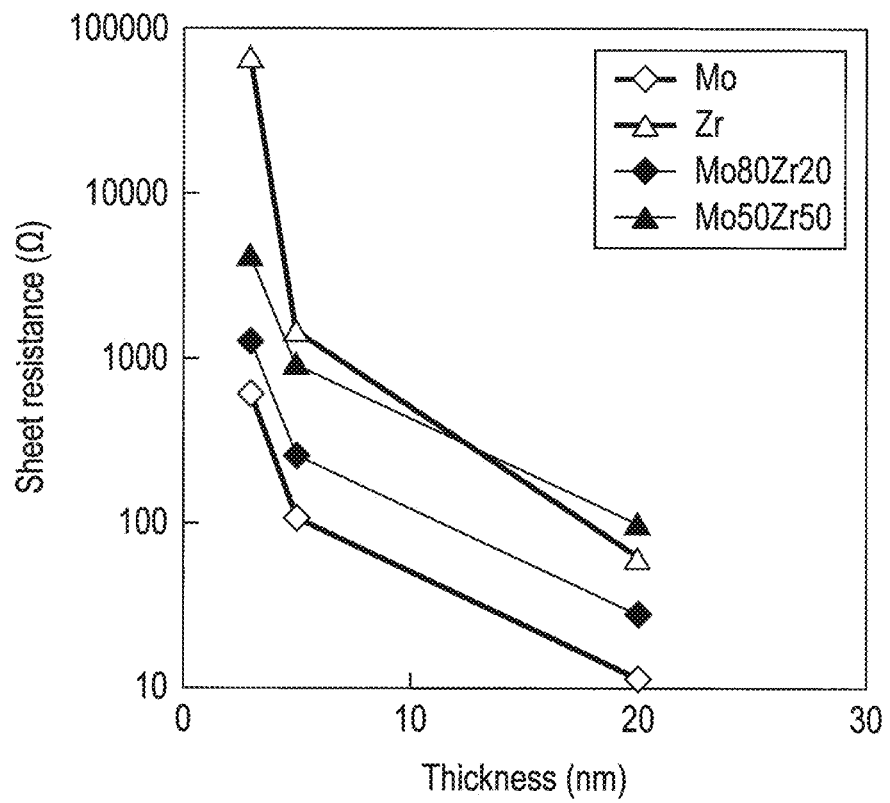
FIG. 12 is a graph showing results of measurement of sheet resistances of the first materials for the underlayer according to the embodiment and a comparative example, after performing an oxidation treatment.
FIG. 13 is a table showing results of measurement of the first materials for the underlayer according to the embodiment and the comparative example.

FIG. 12 is a graph showing results of measurement of sheet resistances of the first materials after an oxidation treatment is performed. The horizontal axis represents a thickness of the first material film before an oxidation treatment (the thickness of the first material film in an as-deposition state). With molybdenum (Mo), the material containing only zirconium (Zr), the material of Mo50Zr50 (Mo: 50 atom %, Zr: 50 atom %), and the material of Mo80Zr20 (Mo: 80 atom %, Zr: 20 atom %), the sheet resistance is considerably higher as the film thickness is thinner than approximately 5 nm. This can be considered because a resistance value of the first material film is increased by oxidation of the first material film.

FIG. 13 is a table showing the above-described measurement results. The equation R*=R(5 nm)/R(20 nm) represents a ratio of the sheet resistance based on the measurement results of FIG. 12. The value R(5 nm) is the value of the sheet resistance after the oxidation treatment is performed on the first material film whose thickness before the oxidation treatment (the thickness of the first material film in an as-deposition state) is 5 nm. The value R(20 nm) is the value of the sheet resistance after the oxidation treatment is performed on the first material film whose thickness before the oxidation treatment (the thickness of the first material film in an as-deposition state) is 20 nm. The sheet resistance is reverse proportional to the film thickness; therefore, if the first material film is not oxidized, the value of $R^*=R(5 \text{ nm})/R(20 \text{ nm})$ is theoretically 4. As the film thickness is smaller, a ratio of a film thickness of an oxidized region to a total film thickness is larger; therefore, the value of $R^*$ is larger than 4. Further, FIG. 13 shows presence or absence of an XRD peak based on the measurement results of FIG. 9. Specifically, FIG. 13 shows presence or absence of an XRD peak with respect to the first material film whose thickness before the oxidation treatment is 20 nm. Only in the case that the material of Mo50Zr50 (Mo: 50 atom % and Zr: 50 atomic) is used, an XRD peak is not observed, which means that an excellent amorphous state is maintained.

Figures 14, 15:
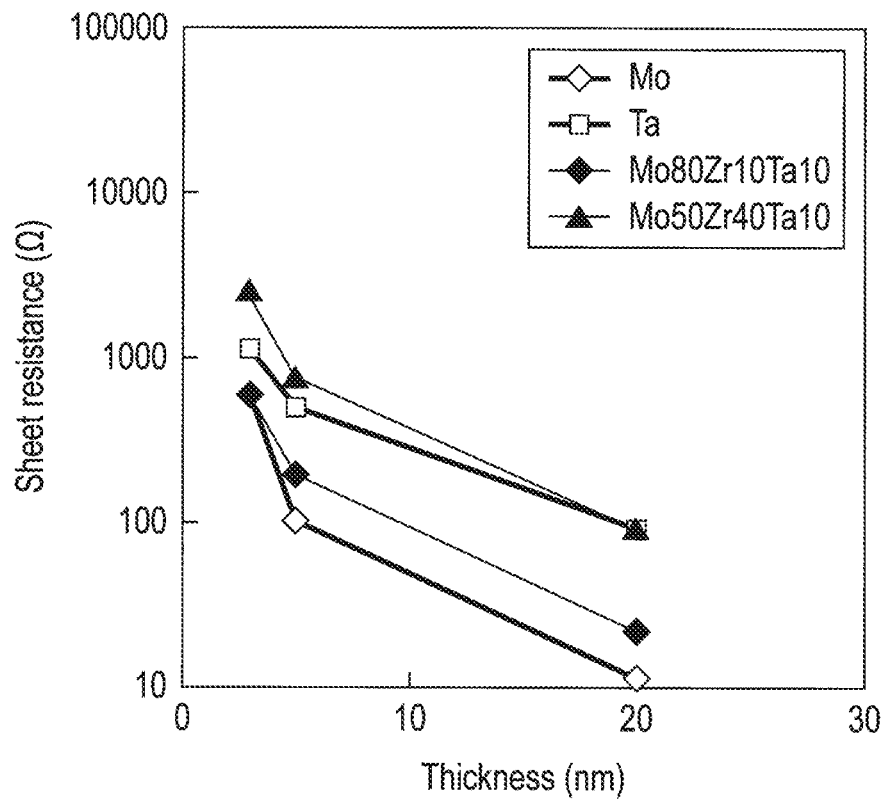
FIG. 14 is a graph showing results of measurement of sheet resistances of the first materials for the underlayer according to the embodiment and a comparative example, after performing an oxidation treatment.
FIG. 15 is a table showing results of measurement of the first materials for the underlayer according to the embodiment and the comparative example.

FIG. 14 is a graph showing the measurement results of the sheet resistances after an oxidation treatment is performed on the first materials. Similarly to FIG. 12, the horizontal axis represents a thickness of the first material film before an oxidation treatment (the thickness of the first material film in an as-deposition state). With respect to any of the material containing only molybdenum (Mo), the material containing only tantalum (Ta), the material of Mo80Zr10Ta10 (Mo: 80 atom %, Zr: 10 atom %, and Ta: 10 atom %), and the material of Mo50Zr40Ta10 (Mo: 50 atom %, Zr: 40 atom %, and Ta: 10 atom %), the sheet resistance is considerably high when the film thickness is thinner than approximately 5 nm. This can be considered because a resistance value of the first material film is increased by oxidation of the first material film.

FIG. 15 is a table showing the above-described measurement results. The equation $R^*=R(5 \text{ nm})/R(20 \text{ nm})$ represents a ratio of the sheet resistance based on the measurement results of FIG. 14. A definition of the equation $R^*=R(5 \text{ nm})/R(20 \text{ nm})$ is the same as the definition of FIG. 13. Similarly to the case of FIG. 13, as the film thickness is smaller, a ratio of a film thickness of an oxidized region to a total film thickness is larger; therefore, the value of $R^*$ is larger than 4. Further, FIG. 15 shows presence or absence of an XRD peak based on the measurement results of FIG. 9. Specifically, FIG. 15 shows presence or absence of an XRD peak with respect to the first material film whose thickness before the oxidation treatment is 20 nm. Only in the case that the material of Mo50Zr40Ta10 (Mo: 50 atom %, Zr: 40 atom %, and Ta: 10 atom %) is used, an XRD peak is not observed, which means that an excellent amorphous state is maintained.

Figure 16:
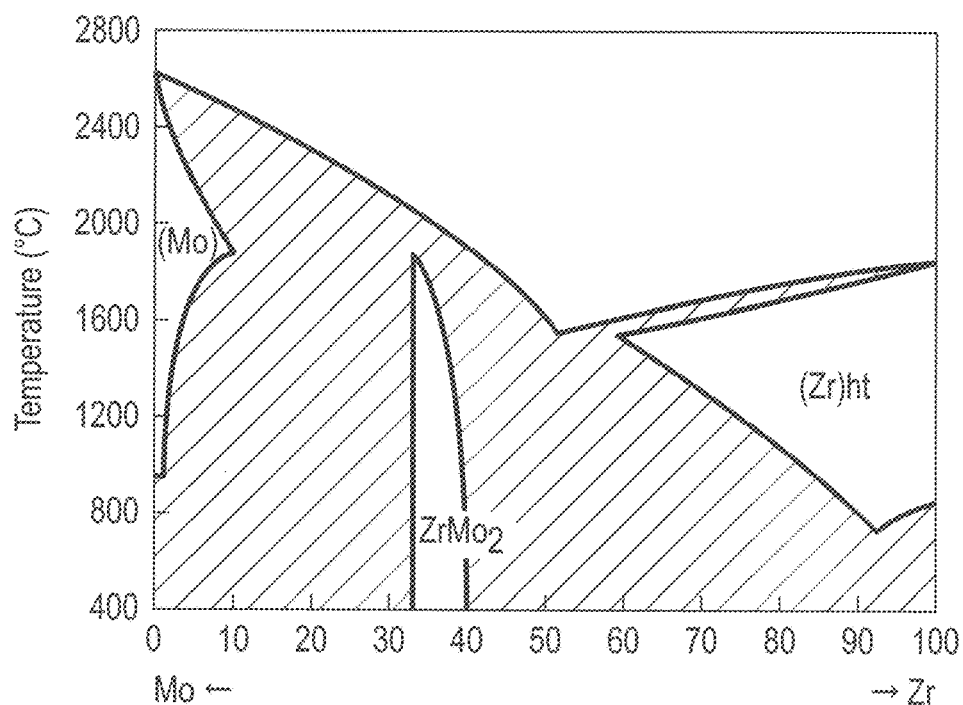
FIG. 16 is a chart showing a crystalline state of molybdenum (Mo) and zirconium (Zr) at different composition ratios at different temperatures.

FIG. 16 is a chart showing a crystalline state of molybdenum (Mo) and zirconium (Zr) at different composition ratios at different temperatures (NIMS Inorganic Material. Database: Yibin Xu, Masayoshi Yamazaki, and Pierre Villars: inorganic Materials Database for Exploring the Nature of Material: Jpn. J. Appl. Phys. 50 (2001) 11RH02). The hatched line region is a phase separation region, in which region solid-solved alloy phase hardly grows.

From the measurement results shown in FIG. 9 to FIG. 15, it can be understood that in the case that the first material containing molybdenum (Mo) and zirconium (Zr) is used as the underlayer 20, if the composition ratio of Mo is 50%, the first material is appropriate material for the underlayer 20 and that if the composition ratio of Mo is 80%, the first material is not appropriate material for the underlayer 20. Further, as shown in the property chart of FIG. 16, in the region in which the composition ratio of Mo is 60% to 67% (in the region in which the composition ratio of Zr is 33% to 40%), an alloyed crystal layer tends to be generated at low temperatures. Therefore, in the case that the first material containing molybdenum (Mo) and zirconium (Zr) is used as the underlayer 20, it is preferable that the composition ratio of molybdenum (Mo) contained in the underlayer 20 be lower than 60%. Also in the case that the first material further contains tantalum (Ta) in addition to molybdenum (Mo) and zirconium (Zr), it is preferable that the composition ratio of molybdenum (Mo) contained in the underlayer 20 is lower than 60%.

Next, a case will be described in which a material containing magnesium (Mg) and tantalum (Ta) as the second material is used for the underlayer 20. In this case the second material contains magnesium (Mg) as the first predetermined element and tantalum (Ta) as the second predetermined element. In the case that the second material is used, it is preferable that the composition ratio of magnesium (Mg) contained in the underlayer 20 be higher than 50%.

Hereinafter, a description will be given on the second material with reference to various measurement results. Note that each measurement is conducted using a sample in which a second material film is formed on a silicon oxide substrate.

Figure 17:
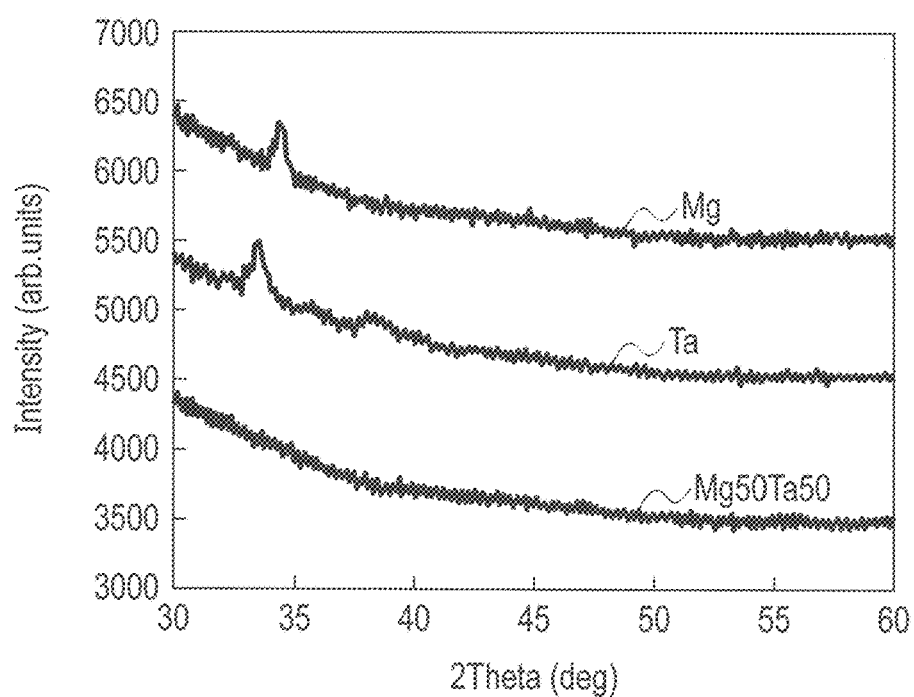
FIG. 17 is a graph showing results of XRD measurement of second materials for the underlayer according to the embodiment and a comparative example, in an as-deposition state.

FIG. 17 is a graph showing results of XRD measurement of the second materials in an as-deposition state. As shown in FIG. 17, a peak is observed with respect to any of the material containing only magnesium (Mg) and the material containing only tantalum (Ta). In contrast, no peak is observed with respect to the material of Mg50Ta50 (Mg: 50 atom % and Ta: 50 atom %). Therefore, it is understood that the materials having no peak observed (Mg50Ta50) have no crystallinity and are in an amorphous structure.

Figure 18:
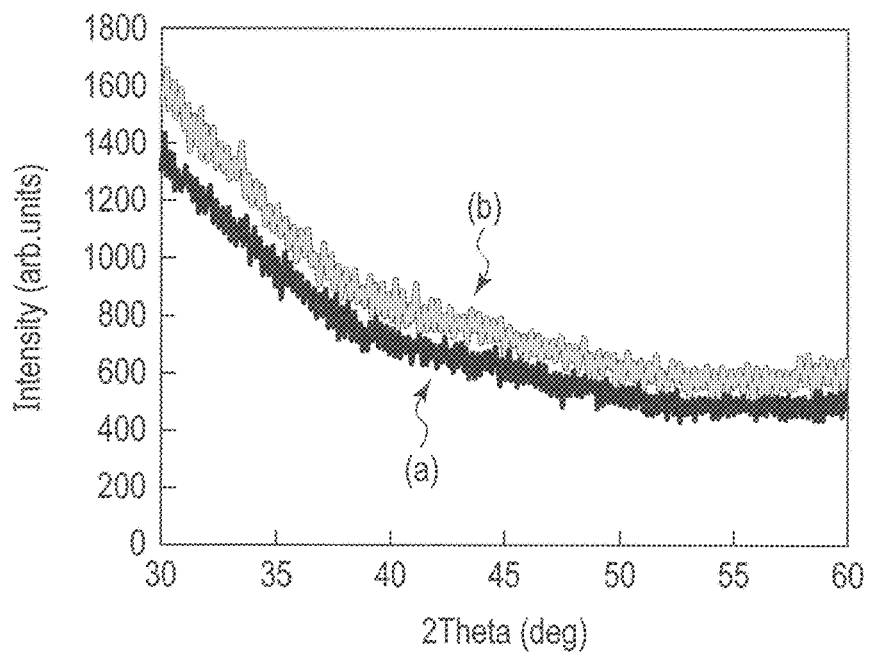
FIG. 18 is a graph showing results of XRD measurement of a second material for the underlayer according to the embodiment.

FIG. 18 is a graph showing XRD measurement results of a material of Mg50Ta50 (Mg: 50 atom % and Ta: 50 atom %). The symbol represents the measurement result in an as-deposition state, and the symbol (b) represents the measurement result after annealing at a temperature of 300° C. No peak is observed in any of the as-deposition state and the state after annealing. Therefore, it can be understood that the material of Mg50Ta50 stays in an excellent amorphous state after annealing is performed.

Figure 19:
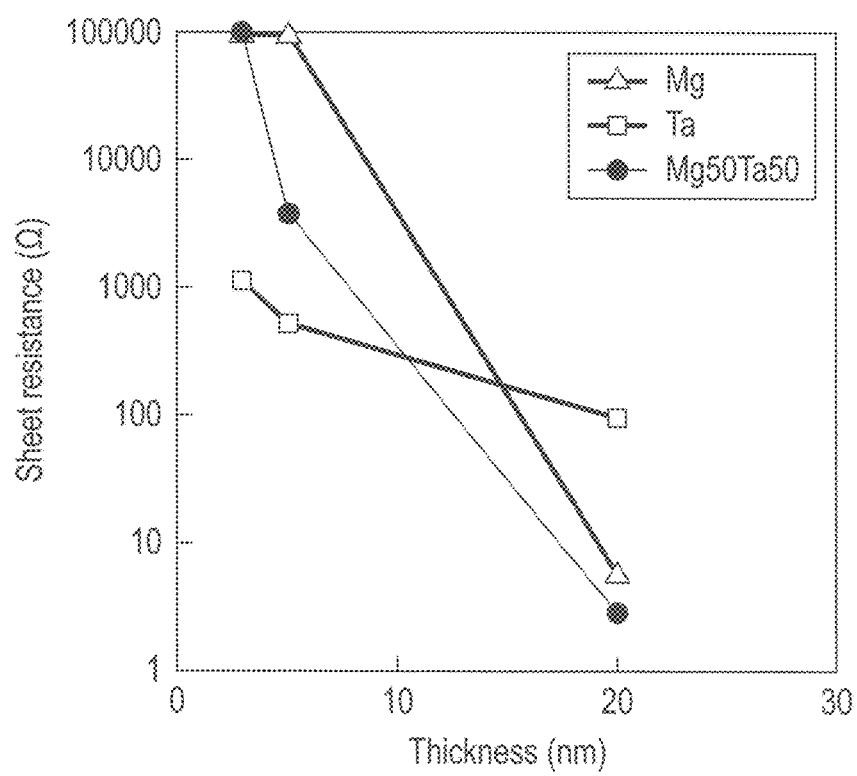
FIG. 19 is a graph showing results of measurement of sheet resistances of the second materials for the underlayer according to the embodiment and the comparative example, after performing an oxidation treatment.

FIG. 19 is a graph showing measurement results of the sheet resistances after an oxidation treatment is performed on the second materials. The horizontal axis represents a thickness of the second material film before the oxidation treatment (the thickness of the second material film in an as-deposition state). With respect to the material containing only magnesium (Mg) and the material of Mg50Ta50 (Mg: 50 atom % and Ta: 50 atom %), as the film thickness is thinner, the sheet resistance is considerably higher. Similarly to the case of the first material, this can be considered because a resistance value of the second material film is increased by oxidation of the second material film.

FIG. 20 is a table showing the above-described measurement results. The equation $R^*=R(5 \text{ nm})/R(20 \text{ nm})$ represents a ratio of the sheet resistance based on the measurement results of FIG. 19. The definition of the equation $R^*=R(5 \text{ nm})/R(20 \text{ nm})$ is the same as the definition described with reference to FIG. 13. With respect to the material containing only magnesium (Mg) and the material of Mg50Ta50 (Mg: 50 atom % and Ta: 50 atom %), the value of $R^*$ is very large. Further, FIG. 20 shows presence or absence of an XRD peak based on the measurement results of FIG. 17. Specifically, FIG. 20 shows presence or absence of an XRD peak with respect to the second material film whose thickness before the oxidation treatment is 20 nm. Only in the case that the material of Mg50Ta50 Mg: 50 atom % and Ta: 50 atom %) is used, an XRD peak is not observed, which means that an excellent amorphous state is maintained.

From the measurement results shown in FIG. 17 to FIG. 20, it can be understood that in the case that the second material containing magnesium (Mg) and tantalum (Ta) is used as the underlayer 20, if the composition ratio of Mg is 50%, the second material is appropriate material for the underlayer 20. Therefore, in the case that the second material containing magnesium (Mg) and tantalum (Ta) is used as the underlayer 20, it is preferable that the composition ratio of magnesium (Mg) contained in the underlayer 20 be higher than 50%.

Next, a case will be described in which manganese (Mn) is used as the third material used for the underlayer 20. In this case the third material contains only manganese (Mn) as a main element. Note that the main element here is an element which is a main component of the third material, and a small amount of additive element and the like are not included in the main element. For example, the third material contains 99 atom % or more of manganese (Mn).

Hereinafter, a description will be given on the third material with reference to various measurement results. Note that each measurement is conducted using a sample in which a third material film is formed on a silicon oxide substrate.

FIG. 21 is a graph showing results of XRD measurement of the third materials in an as-deposition state. As shown in FIG. 21, a peak is observed with respect to the material of Mn80Pd20 (Mn: 80 atom % and Pd: 20 atom %). In contrast, no peak is observed with respect to the material containing only manganese (Mn). Therefore, it is understood that the material containing only manganese (Mn) has no crystallinity and is in an amorphous structure.

FIG. 22 shows results or XRD measurement or the material containing only manganese (Mn). The symbol (a) represents the measurement result in an as-deposition state, and the symbol (b) represents the measurement result after annealing at a temperature of 300° C. No peak is observed in any of the as-deposition state and the state after annealing. Therefore, it can be understood that the material containing only Mn stays in an excellent amorphous state after the annealing is performed.

FIG. 23 is a graph showing results of measurement of sheet resistances after an oxidation treatment is performed on the third materials. The horizontal axis represents a thickness of the third material film before an oxidation treatment (the thickness of the third material film in an as-deposition state). With respect to the material of Mn80Pd20 (Mn: 80 atom % and Pd: 20 atom %), the sheet resistance is not higher as the film thickness is thinner. In contrast, with respect to the material containing only manganese (Mn), the sheet resistance is considerably higher as the film thickness is thinner. Similarly to the case of the first material, this can be considered because a resistance value of the third material film is increased by oxidation of the third material film.

Figures 24, 25:
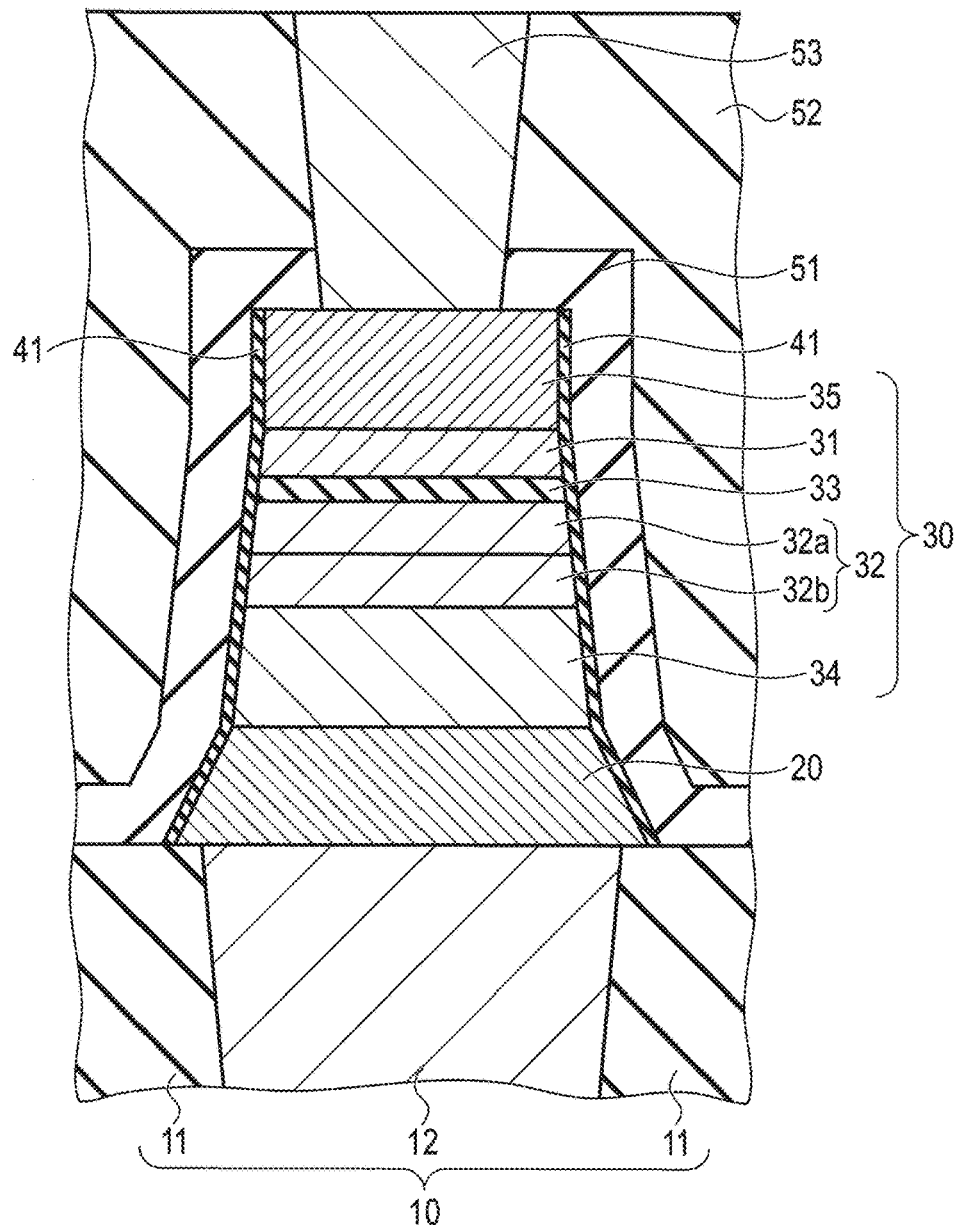
FIG. 24 is a table showing results of measurement of the third materials for an underlayer according to the embodiment and the comparative example.
FIG. 25 is a cross-sectional view schematically showing a configuration of a magnetic memory device according to a variation example of the embodiment.

FIG. 24 is a table showing the above-described measurement results. The equation $R^*=R(5\ nm)/R(20\ nm)$ represents a ratio of the sheet resistance based on the measurement results of FIG. 23. The definition of the equation $R^*=R(5\ nm)/R(20\ nm)$ is the same as the definition described with reference to FIG. 13. With respect to the material containing only manganese (Mn), the value of $R^*$ is very large. Further, FIG. 24 shows presence or absence of an XRD peak based on the measurement results of FIG. 21. Specifically, FIG. 24 shows presence or absence of an XRD peak with respect to the third material film whose thickness before the oxidation treatment is 20 nm. In the case that the material containing only manganese (Mn) is used, there is no XRD peak after annealing is performed. Therefore, in the case that the material containing only manganese (Mn) stays in an excellent amorphous state after annealing is performed.

From the measurement results shown in FIG. 21 to FIG. 24, it can be considered that the material containing only manganese (Mn) as the main element is also appropriate as the material for the underlayer 20.

As described above, according to the present embodiment, the conductive underlayer 20 containing at least the first predetermined element and having an amorphous structure is used; thus, it is possible to obtain the underlayer 20 which is excellent in flatness and has low resistance. Therefore, the quality stacked structure 30 excellent in crystallinity can be formed, and it is possible to secure enough write and read currents. Further, since the underlayer 20 of the present embodiment is used, it is easy to oxidize the sidewall layer 42 formed on the sidewall of the stacked structure 30 and to thus convert the sidewall layer 42 into the insulating sidewall layer 41; therefore, it is possible to prevent a shunt failure on the sidewall.

In addition, the underlayer 20 does not need to contain an element such as boron (B) which adversely affects the properties of the stacked structure 30; therefore, it is possible to prevent deterioration of the properties of the magnetoresistive element due to diffusion of such an element into the stacked structure 30. Note that in the above-described embodiment, the storage layer 31 and the reference layer 32 contain boron (B); however, the storage layer 31 and the reference layer 32 are formed while the concentrations of boron (B) are being precisely controlled. Therefore, the boron (B) in the storage layer 31 and the reference layer 32 cannot be a major cause of deterioration of the properties of the magnetoresistive element. In contrast, it is very difficult to precisely control the amount of boron (B), contained in the underlayer 20, diffusing into the stacked structure 30, and the boron (B) is a large cause of deterioration of the properties of the magnetoresistive element. In the present embodiment, without making the underlayer 20 contain an element such as boron (B), the above-described excellent magnetoresistive element can be obtained.

In addition, in the present embodiment, easy oxidation by the first predetermined element can be secured by using the underlayer 20 containing the first predetermined element and the second predetermined element, and easy formation of an amorphous structure can be secured by the second predetermined element; therefore, the above-described excellent underlayer 20 can be effectively obtained.

As described above, according to the present embodiment, by providing the above-described underlayer 20, it is possible to obtain a magnetoresistive element having excellent properties.

FIG. 25 is a cross-sectional view schematically showing a configuration of magnetic memory device according to a variation example of the present embodiment. Note that since basic items are the same as those in the above-described embodiment, the items described in the above-described embodiment are not described again.

In the above-described embodiment, the storage layer (the first magnetic layer) 31 is provided between the underlayer 20 and the nonmagnetic layer 33; however, in the present variation example, the reference layer (the second magnetic layer) 32 and the shift canceling layer (the third magnetic layer) 34 are provided between the underlayer 20 and the nonmagnetic layer 33. A basic configuration material and a basic manufacturing method are similar to the basic configuration material and the basic manufacturing method in the above-described embodiment.

Also in the present variation example, by using an underlayer 20 similar to that in the above-described embodiment, an effect similar to that in the above-described embodiment can be obtained, and a magnetoresistive element having excellent properties can thus be obtained.

Figure 26:
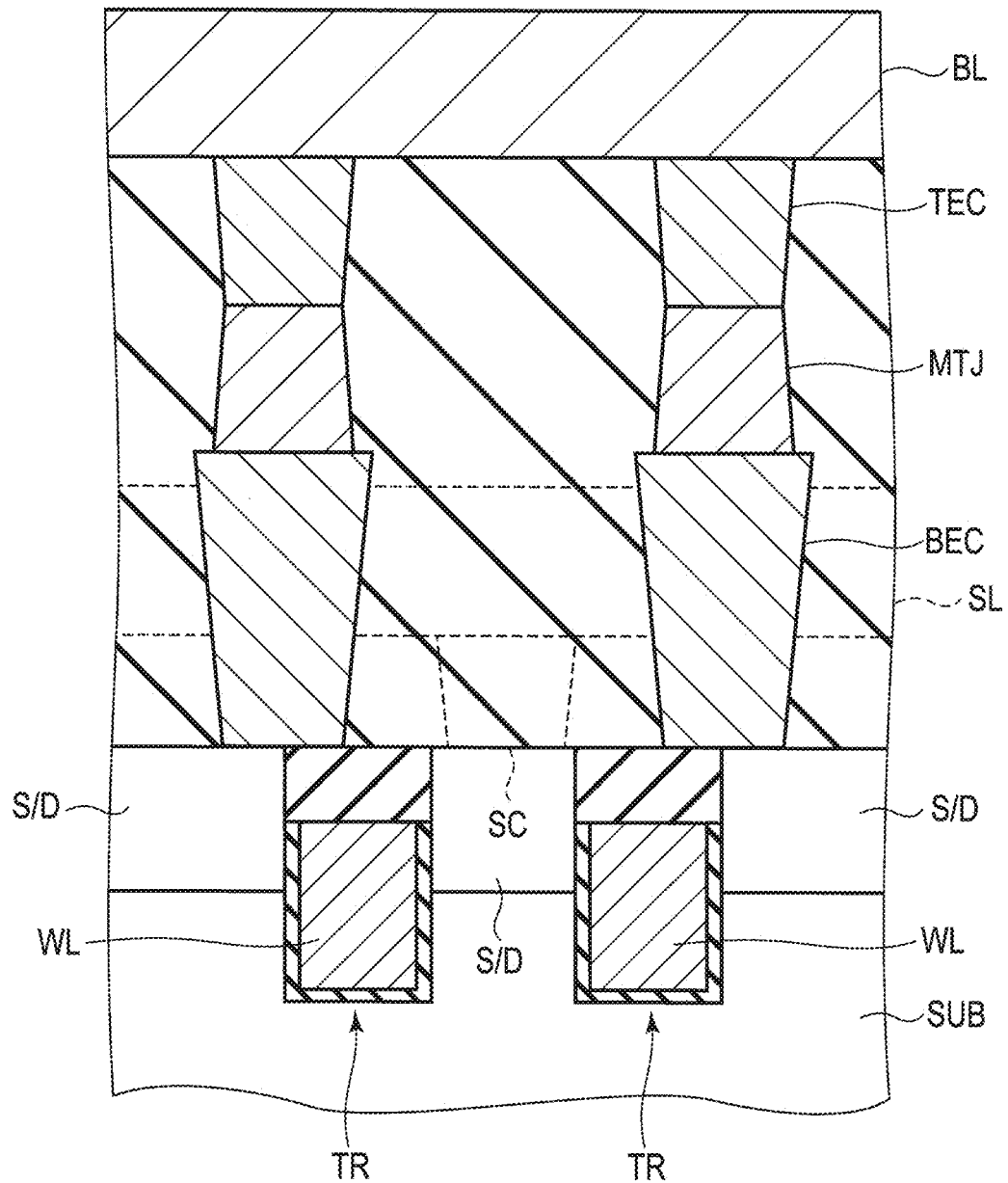
FIG. 26 is a cross-sectional view schematically showing an example of a general configuration of a semiconductor integrated circuit device to which the magnetoresistive element of the embodiment is applied.

FIG. 26 is a cross-sectional view schematically showing an example of a general configuration of a semiconductor integrated circuit device to which a magnetoresistive element of the above-described embodiment is applied.

Buried gate type MOS transistors TR are formed in a semiconductor substrate SUB. Gate electrodes of the buried gate type MOS transistors TR are each used as a word-line WL. A bottom electrodes BEC is connected to one of source/drain regions S/D of each buried gate type MOS transistor TR, and a source line contact SC is connected to the other of the source/drain regions S/D.

On each of the bottom electrodes BEC, there is formed a magnetoresistive element MTJ, and on the magnetoresistive element MTJ, there is formed a top electrode TEC. To the top electrode TEC, there is connected a bit-line BL. A source line SL is connected to the source line contact SC.

By applying such a magnetoresistive element as described in the above-described embodiment to such a semiconductor integrated circuit device as described with reference to FIG. 26, it is possible to obtain an excellent semiconductor integrated circuit device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
    a conductive underlayer having an amorphous structure and containing at least one first element and at least one second element; and
    a stacked structure provided on the underlayer, and including a first magnetic layer having a variable magnetization direction, a second magnetic layer having a fixed magnetization direction, and a nonmagnetic layer provided between the first magnetic layer and the second magnetic layer,
    wherein a combination of the first element and the second element is selected from the following combinations: molybdenum (Mo) and zirconium (Zr), molybdenum (Mo) and tantalum (Ta), molybdenum (Mo) and hafnium (Hf), molybdenum (Mo) and niobium (Nb), magnesium (Mg) and zirconium (Zr), magnesium (Mg) and tantalum (Ta), magnesium (Mg) and niobium (Nb), rhenium (Re) and zirconium (Zr), rhenium (Re) and tantalum (Ta), rhenium (Re) and hafnium (Hf), rhenium (Re) and niobium (Nb), tungsten (W) and zirconium (Zr), tungsten (W) and tantalum (Ta), tungsten (W) and hafnium (Hf), tungsten (W) and niobium (Nb), vanadium (V) and zirconium (Zr), vanadium (V) and tantalum (Ta), vanadium (V) and hafnium (Hf), vanadium (V) and niobium (Nb), manganese (Mn) and zirconium (Zr), manganese (Mn) and tantalum (Ta), manganese (Mn) and hafnium (Hf), and manganese (Mn) and niobium (Nb).

2. The device according to claim 1, wherein the underlayer contains molybdenum (Mo) and zirconium (Zr).

3. The device according to claim 2, wherein the underlayer further contains tantalum (Ta).

4. The device according to claim 2, wherein a composition ratio of molybdenum (Mo) contained in the underlayer is lower than 60 atom %.

5. The device according to claim 1, wherein the underlayer contains magnesium (Mg) and tantalum (Ta).

6. The device according to claim 5, wherein a composition ratio of magnesium (Mg) contained in the underlayer is higher than 50 atom %.

7. The device according to claim 1, wherein the underlayer contains only manganese (Mn) as a main element.

8. The device according to claim 1, wherein the underlayer does not contain boron (B).

9. The device according to claim 1, further comprising an insulating sidewall layer provided along a sidewall of the stacked structure, and containing oxygen (O) and at least one of the first element contained in the underlayer.

10. The device according to claim 1, wherein the underlayer is in direct contact with the stacked structure.

11. A magnetic memory device comprising:
    a first electrode;
    a second electrode;
    a conductive underlayer having an amorphous structure and containing at least one first element and at least one second element; and
    a stacked structure including a first magnetic layer having a variable magnetization direction, a second magnetic layer having a fixed magnetization direction, and a nonmagnetic layer provided between the first magnetic layer and the second magnetic layer,
    wherein the stacked structure is provided between the first electrode and the under layer, and the under layer is provided between the second electrode and the stacked structure, and
    wherein a combination of the first element and the second element is selected from the following combinations: molybdenum (Mo) and zirconium (Zr), molybdenum (Mo) and tantalum (Ta), molybdenum (Mo) and hafnium (Hf), molybdenum (Mo) and niobium (Nb), magnesium (Mg) and zirconium (Zr), magnesium (Mg) and tantalum (Ta), magnesium (Mg) and niobium (Nb), rhenium (Re) and zirconium (Zr), rhenium (Re) and tantalum (Ta), rhenium (Re) and hafnium (Hf), rhenium (Re) and niobium (Nb), tungsten (W) and zirconium (Zr), tungsten (W) and tantalum (Ta), tungsten (W) and hafnium (Hf), tungsten (W) and niobium (Nb), vanadium (V) and zirconium (Zr), vanadium (V) and tantalum (Ta), vanadium (V) and hafnium (Hf), vanadium (V) and niobium (Nb), manganese (Mn) and zirconium (Zr), manganese (Mn) and tantalum (Ta), manganese (Mn) and hafnium (Hf), and manganese (Mn) and niobium (Nb).

12. The device according to claim 11, wherein the underlayer contains molybdenum (Mo) and zirconium (Zr).

13. The device according to claim 12, wherein the underlayer further contains tantalum (Ta).

14. The device according to claim 12, wherein a composition ratio of molybdenum (Mo) contained in the underlayer is lower than 60 atom %.

15. The device according to claim 11, wherein the underlayer contains magnesium (Mg) and tantalum (Ta).

16. The device according to claim 15, wherein a composition ratio of magnesium (Mg) contained in the underlayer is higher than 50 atom %.

17. The device according to claim 11, wherein the underlayer contains only manganese (Mn) as a main element.

18. The device according to claim 11, wherein the underlayer does not contain boron (B).

19. The device according to claim 11, further comprising an insulating sidewall layer provided along a sidewall of the stacked structure, and containing oxygen (O) and at least one of the first element contained in the underlayer.

20. The device according to claim 11, wherein the underlayer is in direct contact with the stacked structure.

* * * * *